United States Patent
Chen

(10) Patent No.: US 6,627,001 B2
(45) Date of Patent: Sep. 30, 2003

(54) METHOD FOR CLEANING A SEMICONDUCTOR WAFER

(75) Inventor: Chung-Tai Chen, Hsinchu Hsien (TW)

(73) Assignee: Macronix International Co., Ltd., Hsinchu (TW)

(*) Notice: Subject to any disclaimer, the term of this patent is extended or adjusted under 35 U.S.C. 154(b) by 28 days.

(21) Appl. No.: 09/895,548

(22) Filed: Jun. 28, 2001

(65) Prior Publication Data

US 2002/0166572 A1 Nov. 14, 2002

(30) Foreign Application Priority Data

May 10, 2001 (TW) ........................................ 90111126 A

(51) Int. Cl.$^7$ ................................................ B08B 3/08
(52) U.S. Cl. ................ 134/3; 134/27; 134/28; 134/29; 134/902
(58) Field of Search .............................. 134/3, 27, 28, 134/29, 902

(56) References Cited

U.S. PATENT DOCUMENTS

| | | | | |
|---|---|---|---|---|
| 5,427,627 A | * | 6/1995 | Canestaro et al. | ............ 134/29 |
| 5,482,174 A | * | 1/1996 | Namiki et al. | ................ 134/27 |
| 6,240,933 B1 | * | 6/2001 | Bergman | .................... 134/1.3 |

* cited by examiner

Primary Examiner—Zeinab El-Arini
(74) Attorney, Agent, or Firm—J.C. Patents

(57) ABSTRACT

A semiconductor wafer cleaning method is provided. After cleaning the wafer with a chemical cleaning solution, the wafer is placed in a cleansing tank that fills with deionized water. A neutralizer is then added to the cleansing tank. The surface of the wafer is then neutralized to a neutral pH value. Thereafter, the chemical cleaning solution residue on the wafer surface is removed by cleaning the wafer with deionized water.

27 Claims, 2 Drawing Sheets

METHOD FOR CLEANING A SEMICONDUCTOR WAFER

CROSS-REFERENCE TO RELATED APPLICATION

This application claims the priority benefit of Taiwan application serial no. 90111126, filed May 10, 2001.

BACKGROUND OF THE INVENTION

1. Field of Invention

This invention relates to a fabrication method for a semiconductor device. More particularly, the present invention relates to a method for cleaning a semiconductor wafer.

2. Description of Related Art

In the fabrication process of integrated-circuit devices, wafer cleaning is the most frequent performed processing step. The purpose of wafer cleaning is to remove the organic compound, the metal crud or particulate that is attached to the surface of the wafer. These contaminants greatly affect the subsequent process and the quality of the product. The metal crud contaminant would lead to a current leakage at the p-n junction, a reduction of the lifetime of some carriers and a reduction of the breakdown voltage of the gate oxide layer. The attachment of particulate to the surface of a wafer would definitely affect the accuracy of pattern transferring in a photolithography process. It may even lead to a short circuit. The wafer cleaning process, therefore, must be able to effectively remove the organic compound, the metal crud and particulate. Moreover, a formation of a native oxide layer on the wafer surface after the cleaning process has to be prevented to minimize the surface roughness.

The current industry employs the RCA cleaning process to clean the semiconductor wafer. Referring to FIG. 1, FIG. 1 is a flow diagram, illustrating the basic steps in the RCA cleaning process.

Step 101: Cleaning the wafer using an aqueous solution of a sulfuric acid/hydrogen peroxide mixture (SPM) to remove, for example, the photoresist residue or particulate type of organic contaminant that remains on the wafer surface.

Step 102: Performing a quick-dump rinse (QDR) process by using a large quantity of deionized water to clean the wafer surface and to remove the SPM cleaning solution that remains on the wafer surface.

Step 103: Performing a SC1 cleaning process using the SC1 cleaning solution ($NH_4OH/H_2O_2/H_2O=1:1:5$), also known as APM, at a temperature of 75 degrees Celsius to 85 degrees Celsius to clean the wafer and to remove the organic compound and particulate that attache to the wafer surface.

Step 104: Performing a quick-dump rinse (QDR) process by using a large quantity of deionized water to clean the wafer surface and to remove the SC1 cleaning solution that remains on the wafer surface.

Step 105: Performing a SC2 cleaning process using the SC2 cleaning solution ($HCl/H_2O_2/H_2O=1:1:6$), also known as HPM, at a temperature of 75 degrees Celsius to 85 degrees Celsius to clean the wafer and to remove the metal crud that attaches to the wafer surface.

Step 106: Performing a quick-dump rinse (QDR) process by using a large quantity of deionized water to clean the wafer surface and to remove the SC2 cleaning solution that remains on the wafer surface.

Step 107: Performing a dilute hydrofluoric acid (DHF) cleaning process by placing the wafer in a dilute hydrofluoric acid aqueous solution ($HF/H_2O=1:99$) to remove the native oxide layer on the wafer.

Step 108: Performing a quick-dump rinse (QDR) process by using a large quantity of deionized water to clean the wafer surface and to remove the DHF cleaning solution that remains on the wafer surface.

Step 109: Performing a rinsing process by placing the wafer into the final rinse (FR) tank to further clean the wafer.

Step 110: Performing a drying process by placing the wafer in a drying station, for example, in an isopropyl alcohol (IPA) station using the IPA vapor to remove the moisture on the wafer and to dry wafer.

After the completion of the cleaning processes 101, 103 and 105 in the above RCA process, a quick-dump rinse process is performed using deionized water to sufficiently clean the wafer in order to prevent the SPM, the SC1 and the SC2 cleaning solution to remain on the wafer surface. The SPM cleaning solution, however, is very viscous and is very difficult to remove. Furthermore, the SPM cleaning solution that remains on the wafer easily forms crystal when it comes in contact with air. Therefore, in order to remove the SPM cleaning solution residue, a huge quantity of deionized water is required in the subsequent quick-dump rinse process to completely remove the SPM cleaning solution residue.

SUMMARY OF THE INVENTION

The present invention provides a semiconductor wafer cleaning method, wherein after the chemical cleaning process and before the quick-dump rinse process, an acid-base neutralizing step is performed. Using various diluted acid solution and basic solution to neutralize the pH value of the wafer surface, the quantity of deionized water used in the quick-dump rinse process is thus reduced. As a result, the manufacturing cost is reduced and the efficiency of the process is increased.

The present invention provides a cleaning method for a semiconductor wafer, wherein subsequent to the chemical cleaning of the wafer, a neutralizer is added to a chemical cleaning tank that fills with deionized water, to neutralize the pH of the wafer surface. Thereafter, a quick-dump rinse process is conducted to remove the chemical cleaning solution debris on the wafer surface.

The invention provides a wafer cleaning method, wherein subsequent to the chemical cleaning process and before the quick-dump rinse process, a neutralizer is added to a tank of deionized water such that the wafer surface is neutralized to a neutral pH value. The quantity of deionized water used in the subsequent quick-dump rinse process is thus reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
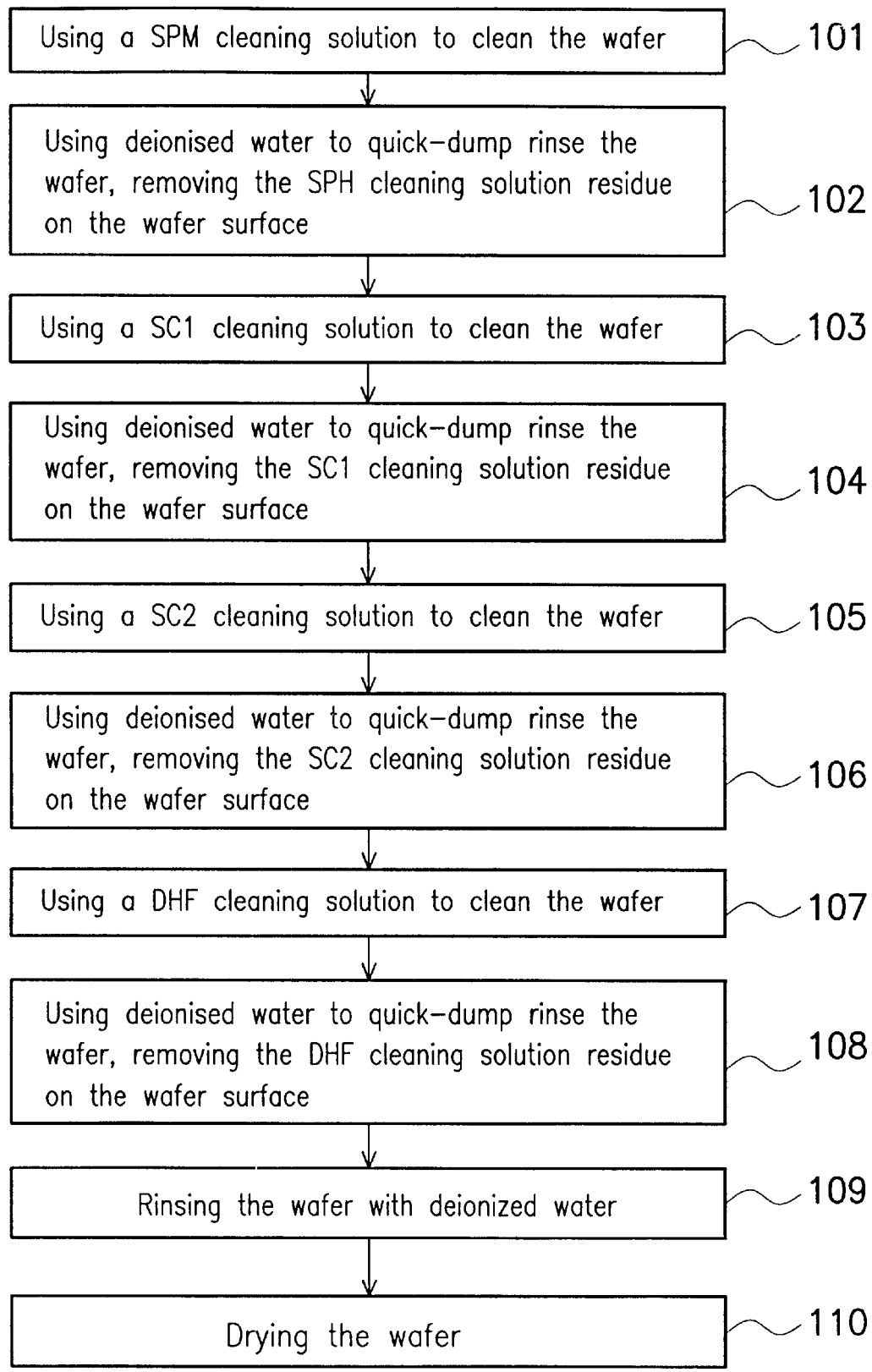
FIG. 1 is a flow diagram, illustrating the successive steps in the conventional RCA cleaning process.
Figure 2:
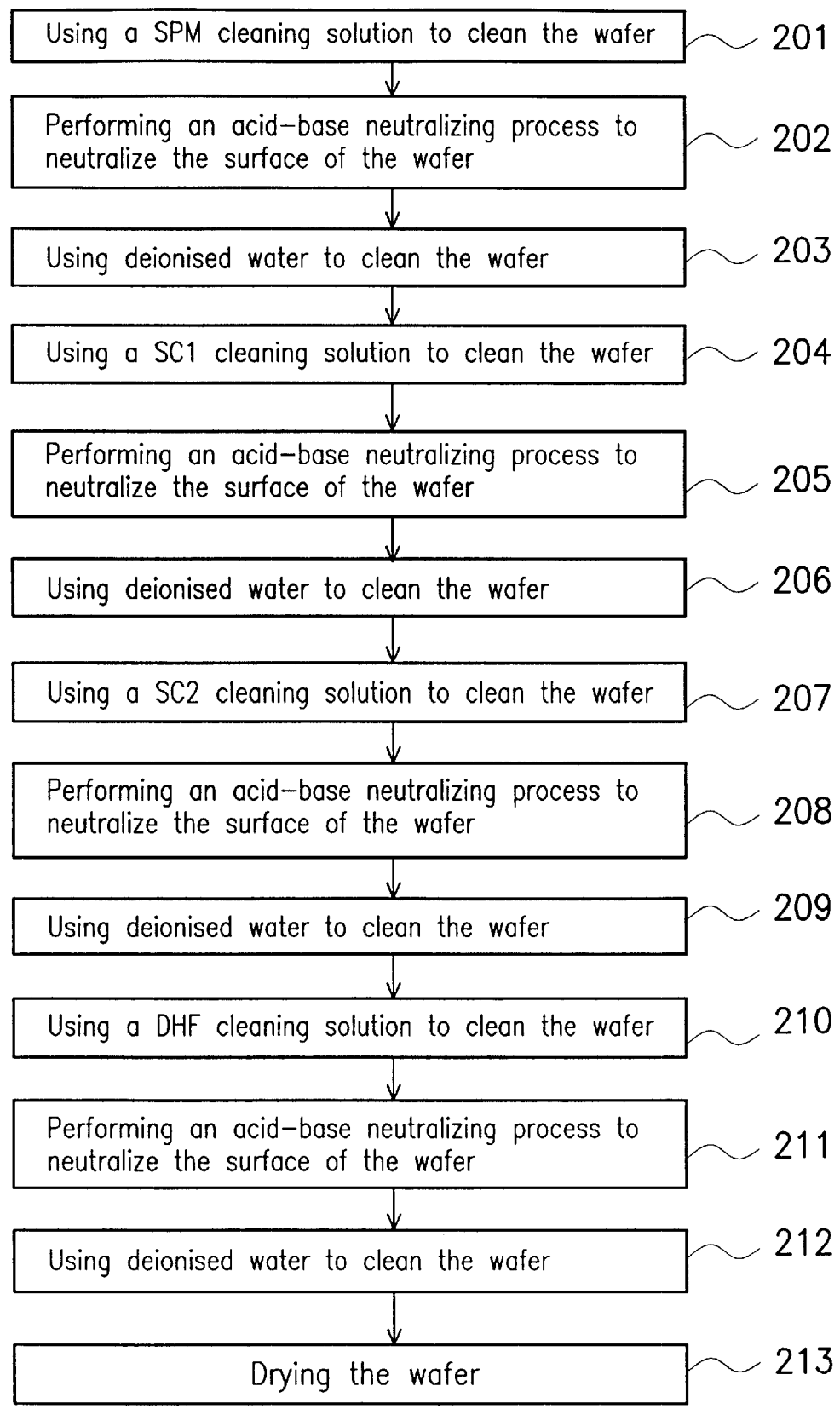
FIG. 2 is a flow diagram, illustrating the successive steps of a semiconductor wafer cleaning method according to a preferred embodiment of the present invention.

Referring to FIG. 2, FIG. 2 is a flow diagram, illustrating the successive steps of a semiconductor wafer cleaning method according to a preferred embodiment of the present invention.

Step 201: An acid chemical solution is used to clean the wafer and to remove the organic contaminant that is attached to the wafer surface. The acid chemical solution is, for example, an aqueous solution of a sulfuric acid/hydrogen peroxide mixture (SPM). A wafer to be cleaned is provided and is placed in a chemical cleaning tank, for example a SPM cleaning tank. The SPM cleaning solution is delivered to the SPM cleaning tank to clean the wafer. The SPM cleaning of a wafer includes spraying the SPM cleaning solution onto the wafer surface, to flush the wafer surface with the SPM cleaning solution. Another approach for the SPM cleaning of a wafer includes soaking the wafer in the SPM solution. The cleaning temperature is about 120 degree Celsius and the cleaning is conducted for about 10 minutes.

Step 202: An acid-base neutralizing process is conducted. The wafer, subsequent to the SPM cleaning process, is placed in a cleansing tank, which fills with deionized water. A neutralizer is then delivered to the cleansing tank. The neutralizer is, for example, a basic solution. The basic solution reacts with and neutralizes the SPM cleaning solution residue on the wafer surface. The SPM cleaning solution residue is thus removed. In the cleansing tank, a pH meter is installed to determine the pH value of the solution in the cleansing tank. The solution in the cleansing tank approaches neutral by controlling the amount of the basic solution being delivered to the cleansing tank. The concentration and the flow rate of the basic solution are also well monitored to prevent a precipitation to occur. The basic solution used in neutralizing the SPM cleaning solution residue includes ammonia solution or an aqueous solution of salt of metal. The SPM solution can also be recycled to reduce the manufacturing cost.

Step 203: The quick-dump rinse (QDR) process, using deionized water to clean the wafer surface and to remove the SPM cleaning solution residue on the wafer surface, is performed. The neutralized wafer is placed in a tank with running water and is cleaned with deionized water. Since a majority of the SPM cleaning solution residue on the wafer surface is removed after the wafer is being neutralized, a shorter cleaning time is required to achieve the cleaning of the wafer. The quantity of deionized water used is also reduced.

Step 204: A basic chemical solution is used to clean the wafer to remove the organic compound and particulate that are attached to the wafer surface. The basic cleaning solution, for example a SC1 cleaning solution, which is an aqueous solution of an ammonium/hydrogen peroxide/deionized water mixture.

The wafer is placed in a SC1 chemical cleaning tank. The SC1 cleaning solution is delivered to the SC1 chemical cleaning tank to clean the wafer. The wafer is cleaned, for example, by spraying the SC1 solution onto the surface of the wafer and flushing the surface of the wafer with the SC1 solution. Another approach for the SC1 chemical cleaning includes soaking the wafer in the SC1 solution in combination with an ultrasound vibration. The weight ratio of ammonium/hydrogen peroxide/deionized water ratio in the SC1 cleaning solution is about 1:1:5. The cleaning is conducted at a temperature of about 75 degrees Celsius to about 85 degrees Celsius for about 5 minutes.

Step 205: An acid-base neutralizing process is conducted. Subsequent to the cleaning with the SC1 cleaning process, the wafer is placed in a cleansing tank that fills with deionizied water. A neutralizer, for example, an acid solution, is then delivered to the cleansing tank. The acid solution reacts with and neutralizes the SC1 cleaning solution residue on the wafer surface. The SC1 cleaning solution residue is thus removed. A pH meter is installed in the cleansing tank to determine the pH value of the solution in the cleansing tank. The solution in the cleansing tank approaches a neutral pH value by controlling the amount of the acid solution being delivered to the cleansing tank. The concentration and the flow rate of the acid solution are also well monitored to prevent a precipitation to occur. The acid solution used in neutralizing the SC1 solution includes sulfuric acid, hydrofluoric acid (DHF) or hydrochloric acid. The SC1 solution and the DHF solution can be recycled to reduce the manufacturing cost.

Step 206: A quick-dump rinse (QDR) process, using deionized water to clean the wafer surface and to remove the SC1 cleaning solution residue on the wafer surface, is performed. The neutralized wafer is placed in a tank of running water and is cleaned with deionized water. After being neutralized, the majority of the SC1 cleaning solution residue on the wafer surface is removed. A shorter cleaning time is required to achieve the cleaning of the wafer. The quantity of deionized water used is also reduced.

Step 207: An acid chemical solution is used to clean the wafer by removing the metal particulate that is attached to the wafer surface. The acid cleaning solution is, for example, a SC2 cleaning solution, which is an aqueous solution of a hydrochloric acid/hydrogen peroxide/deionized water mixture.

The wafer is placed in a SC2 chemical cleaning tank. The SC2 cleaning solution is delivered to the SC2 chemical cleaning tank to clean the wafer. The wafer is cleaned, for example, by spraying the SC2 solution onto the surface of the wafer, to flush the surface of the wafer with the SC2 solution. Another approach of the SC2 chemical cleaning process is by soaking the wafer in the SC2 solution. The weight ratio of hydrochloric acid/hydrogen peroxide/ deionized water in the SC2 chemical solution is about 1:1:6. The cleaning is conducted at a temperature is about 75 degrees Celsius to about 85 degrees Celsius for about 5 minutes.

Step 208: An acid-base neutralizing process is conducted. Subsequent to the cleaning with the SC2 cleaning solution, the wafer is placed in a cleansing tank that fills with deonizied water. A neutralizer, for example, a basic solution is then delivered to the cleansing tank. The basic solution reacts with and neutralizes the SC2 cleaning solution residue on the wafer surface. The SC2 cleaning solution residue is thus removed. A pH meter is installed in the cleansing tank to determine the pH value of the solution in the cleansing tank. The solution in the cleansing tank approaches a neutral pH value by controlling the amount of the basic solution being delivered to the cleansing tank. The concentration and the flow rate of the basic solution are also well monitored to prevent a precipitation to occur. The SC2 can be recycled to reduce the manufacturing cost.

Step 209: A quick-dump rinse (QDR) process, using deionized water to clean the wafer surface and to remove the SC2 cleaning solution that remains on the surface of the wafer, is performed. The neutralized wafer is placed in a tank of running water and is cleaned with deionized water. Since the majority of the SC2 cleaning solution residue on the surface of the wafer is removed after the wafer is being neutralized, a shorter cleaning time is required to achieve the cleaning of the wafer. The quantity of deionized water used is also reduced.

Step 210: A dilute hydrofluoric acid (DHF) cleaning process is performed by placing the wafer in a dilute hydrofluoric acid aqueous solution (HF/H$_2$O=1:99) to remove the native oxide layer on the wafer.

Step 211: A quick-dump rinse (QDR) process is performed by using a large quantity of deionized water to clean the wafer surface and to remove the DHF cleaning solution that remains on the wafer surface.

Step 212: A rinsing process is performed by placing the wafer into the final rinse (FR) tank. Further combining with an ultrasound vibration, the wafer is cleaned.

Step 213: A drying process is performed by placing the wafer in a drying station, for example, in an isopropyl alcohol (IPA) station using the IPA vapor to remove the water on the wafer and to dry wafer.

The present invention provides a cleaning method for a semiconductor wafer, wherein subsequent to the chemical cleaning of the wafer and before the quick-dump rinse process, a neutralizer is added to a cleansing tank that fills with deionized water to neutralize the pH of the wafer surface. The quantity of deionized water used in the quick-dump rinse process is thus reduced. Moreover, the neutralizer are recycled to further the manufacturing cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for cleaning a semiconductor wafer, comprising:
    providing a wafer;
    placing the wafer in a chemical cleaning tank and cleaning the wafer with a chemical cleaning solution;
    placing the wafer in a cleansing tank that fills with deionized water after the wafer is cleaned with the chemical cleaning solution;
    adding a neutralizer in the cleansing tank to neutralize a surface of the wafer; and
    removing the chemical cleaning solution that remains on the surface of the wafer using deionized water.

2. The method of claim 1, wherein the chemical cleaning solution includes an acid chemical cleaning solution.

3. The method of claim 2, wherein the acid chemical cleaning solution is selected from the group consisting of an aqueous solution of a sulfuric acid/hydrogen peroxide mixture and an aqueous solution of a hydrofluoric acid/hydrogen peroxide/deionized water mixture.

4. The method of claim 3, wherein the neutralizer includes a basic reagent.

5. The method of claim 4, wherein the basic reagent is selected from the group consisting of an aqueous solution of salt of metal, an ammonium solution, an aqueous solution of an ammonium/hydrogen peroxide/deionized water mixture.

6. The method of claim 1, wherein the chemical cleaning solution includes a basic chemical cleaning solution.

7. The method of claim 6, wherein the basic chemical solution includes an aqueous solution of an ammonium/hydrogen peroxide/deionized water mixture.

8. The method of claim 1, wherein the neutralizer includes an acid reagent.

9. The method of claim 8, wherein the acid reagent is selected from the group consisting of an aqueous solution of hydrofluoric acid, an aqueous solution of hydrochloric acid, an aqueous solution of sulfuric acid aqueous solution, an aqueous solution of a hydrochloric acid/hydrogen peroxide/deionized water mixture and an aqueous solution of a sulfuric acid/hydrogen peroxide mixture.

10. A semiconductor wafer cleaning method, comprising:
    providing a wafer;
    using a first chemical cleaning solution to clean the wafer;
    placing the wafer in a first cleaning tank that fills with deionized water after the wafer is cleaned with the first chemical cleaning solution and adding a first neutralizer to the first cleansing tank to neutralize a surface of the wafer to a neutral pH value;
    cleaning the wafer with deionized water to remove a residue of the first chemical cleaning solution on the surface of the wafer;
    using a second chemical cleaning solution to clean the wafer;
    placing the wafer in a second cleansing tank that fills with deionized water after the wafer is cleaned with the second chemical cleaning solution and adding a second neutralizer to the second cleansing tank to neutralize the surface of the wafer to the neutral pH value;
    cleaning the wafer with deionized water to remove a residue of the second chemical cleaning solution on the surface of the wafer;
    using a third chemical cleaning solution to clean the wafer;
    placing the wafer in a third cleansing tank that fills with deionized water after the wafer is cleaned with the third chemical cleaning solution and adding a third neutralizer to the third cleansing tank to neutralize the surface of the wafer to the neutral pH value; and
    cleaning the wafer with deionized water to remove a residue of the third chemical cleaning solution on the surface of the wafer.

11. The method of claim 10, wherein the first chemical cleaning solution includes an aqueous solution of a sulfuric acid/hydrogen peroxide mixture.

12. The method of claim 10, wherein the first neutralizer is selected from the group consisting of an aqueous solution of salt of metal, an ammonium solution, an aqueous solution of an ammonium/hydrogen peroxide/deionized water mixture.

13. The method of claim 10, wherein the second chemical cleaning solution includes an aqueous solution of an ammonium/hydrogen peroxide/deionized water mixture.

14. The method of claim 10, wherein the second neutralizer is selected from the group consisting of an aqueous solution of hydrofluoric acid, an aqueous solution of hydrochloric acid, an aqueous solution of sulfuric acid, an aqueous solution of a hydrochloric acid/hydrogen peroxide/deionized water mixture and an aqueous solution of a sulfuric acid/hydrogen peroxide.

15. The method of claim 10, wherein the third chemical cleaning solution includes an aqueous solution of a hydrochloric acid/hydrogen peroxide/deionized water mixture.

16. The method of claim 10, wherein the third neutralizer is selected from the group consisting of an aqueous solution of salt of metal, an ammonium solution, an aqueous solution of an ammonium/hydrogen peroxide/deionized water mixture.

17. A method for cleaning a semiconductor wafer, comprising:

providing a wafer;

using a first chemical cleaning solution to clean the wafer;

placing the wafer in a first cleansing tank that fills with deionized wafer after the wafer is cleaned with the first chemical cleaning solution and adding a first neutralizer to the first cleansing tank to neutralize a surface of the wafer to a neutral pH value;

cleaning the wafer with deionized water to remove a residue of the first chemical cleaning solution on the surface of the wafer;

using a second chemical cleaning solution to clean the wafer; and placing the wafer in a second cleansing tank that fills with deionized water after the wafer is cleaned with the second chemical cleaning solution and adding a second neutralizer to the second cleansing tank to neutralize the surface of the wafer to the neutral pH value; and cleaning the wafer with deionized water to remove a residue of the second cleaning solution on the surface of the wafer.

18. The method of claim 17, wherein the first chemical cleaning solution includes an aqueous solution of a sulfuric acid/hydrogen peroxide mixture.

19. The method of claim 17, wherein the first chemical cleaning solution includes an aqueous solution of an ammonium/hydrogen peroxide/deionized water mixture.

20. The method of claim 17, wherein the first chemical cleaning solution includes an aqueous solution of a hydrochloric acid/hydrogen peroxide/deionized water mixture.

21. The method of claim 17, wherein the second chemical cleaning solution includes an aqueous solution of a sulfuric acid/hydrogen peroxide mixture.

22. The method of claim 17, wherein the second chemical cleaning solution includes an aqueous solution of an ammonium/hydrogen peroxide/deionized water mixture.

23. The method of claim 17, wherein the second chemical cleaning solution includes an aqueous solution of a hydrochloric acid/hydrogen peroxide/deionized water mixture.

24. The method of claim 17, wherein the first neutralizer is selected from the group consisting of an aqueous solution of metal salt, an ammonium solution, an aqueous solution of an ammonium/hydrogen peroxide/deionized water mixture.

25. The method of claim 17, wherein the first neutralizer is selected from the group consisting of an aqueous solution of hydrofluoric acid, an aqueous solution of hydrochloric acid, and aqueous solution of sulfuric acid, an aqueous solution of hydrochloric acid/hydrogen peroxide/deionized water mixture and an aqueous solution of a sulfuric acid/hydrogen peroxide mixture.

26. The method of claim 17, wherein the second neutralizer is selected from the group consisting of an aqueous solution of metal salt, an ammonium solution, an aqueous solution of an ammonium/hydrogen peroxide/deionized water mixture.

27. The method of claim 17, wherein the second neutralizer is selected from the group consisting of an aqueous solution of hydrofluoric acid, an aqueous solution of hydrochloric acid, and aqueous solution of sulfuric acid, an aqueous solution of hydrochloric acid/hydrogen peroxide/deionized water mixture and an aqueous solution of a sulfuric acid/hydrogen peroxide mixture.

\* \* \* \* \*